(12) United States Patent
Huang

(10) Patent No.: US 11,555,937 B2
(45) Date of Patent: *Jan. 17, 2023

(54) METHOD AND SYSTEM FOR GENERATING SIMULATION GRIDS BY MAPPING A GRID FROM THE DESIGN SPACE

(71) Applicant: ExxonMobil Upstream Research Company, Spring, TX (US)

(72) Inventor: Hao Huang, The Woodlands, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 419 days.

This patent is subject to a terminal disclaimer.

(21) Appl. No.: 16/389,046

(22) Filed: Apr. 19, 2019

(65) Prior Publication Data
US 2019/0392092 A1 Dec. 26, 2019

Related U.S. Application Data

(60) Provisional application No. 62/688,553, filed on Jun. 22, 2018, provisional application No. 62/752,624, (Continued)

(51) Int. Cl.
*G06F 30/20* (2020.01)
*G01V 1/30* (2006.01)
(Continued)

(52) U.S. Cl.
CPC .............. *G01V 1/302* (2013.01); *G01V 1/282* (2013.01); *G01V 1/345* (2013.01); *G01V 99/005* (2013.01);
(Continued)

(58) Field of Classification Search
CPC ........ G01V 1/302; G01V 1/345; G01V 1/282; G01V 99/005; G06T 17/05; G06T 17/20; G06F 30/20
(Continued)

(56) References Cited

U.S. PATENT DOCUMENTS

| 6,106,561 A | 8/2000 | Farmer et al. |
| 9,053,570 B1 | 6/2015 | Mallet et al. |

(Continued)

FOREIGN PATENT DOCUMENTS

EP 2631685 A2 8/2013

OTHER PUBLICATIONS

U.S. Appl. No. 62/688,553, filed Jun. 22, 2018, Lin et al.
(Continued)

*Primary Examiner* — Andre Pierre Louis
(74) *Attorney, Agent, or Firm* — ExxonMobil Upstream Research Company—Law Department

(57) ABSTRACT

Geologic modeling methods and systems disclosed herein employ an improved simulation gridding technique. For example, an illustrative geologic modeling method may comprise: obtaining a geologic model representing a faulted subsurface region in physical space; mapping the physical space geologic model to a design space model representing an unfaulted subsurface region; gridding the design space model to obtain a design space mesh; partitioning cells in the design space mesh with faults mapped from the physical space geologic model, thereby obtaining a partitioned design space mesh; mapping the partitioned design space mesh to the physical space to obtain a physical space simulation mesh; and outputting the physical space simulation mesh.

16 Claims, 5 Drawing Sheets

Related U.S. Application Data filed on Oct. 30, 2018, provisional application No. 62/752,637, filed on Oct. 30, 2018.

(51) Int. Cl.
| | |
|---|---|
| *G01V 1/28* | (2006.01) |
| *G01V 1/34* | (2006.01) |
| *G01V 99/00* | (2009.01) |
| *G06T 17/05* | (2011.01) |
| *G06T 17/20* | (2006.01) |

(52) U.S. Cl.
CPC .............. *G06F 30/20* (2020.01); *G06T 17/05* (2013.01); *G06T 17/20* (2013.01); *G01V 2210/642* (2013.01); *G01V 2210/643* (2013.01)

(58) Field of Classification Search
USPC ........................................................ 703/9, 10
See application file for complete search history.

(56) References Cited

U.S. PATENT DOCUMENTS

| | | | |
|---|---|---|---|
| 9,395,466 | B1 | 7/2016 | Mallet et al. |
| 9,536,022 | B1 | 1/2017 | Tertois et al. |
| 9,600,608 | B2 | 3/2017 | Poudret et al. |
| 9,652,889 | B2 | 5/2017 | Young et al. |
| 10,107,938 | B2 | 10/2018 | Huang et al. |
| 2011/0115787 | A1 | 5/2011 | Kadlec |
| 2012/0265510 | A1 | 10/2012 | Lepage |
| 2013/0204598 | A1* | 8/2013 | Mallet .................... G01V 1/325 703/6 |
| 2013/0218539 | A1* | 8/2013 | Souche .................. G06F 30/20 703/2 |
| 2013/0231903 | A1 | 9/2013 | Li et al. |
| 2013/0246031 | A1 | 9/2013 | Wu et al. |
| 2015/0316683 | A1 | 11/2015 | Purves et al. |
| 2016/0035130 | A1* | 2/2016 | Branets .................. G06T 17/05 345/420 |
| 2016/0124117 | A1* | 5/2016 | Huang .................... G06T 17/05 703/2 |
| 2016/0140269 | A1* | 5/2016 | Wang ...................... G06F 30/23 703/1 |
| 2018/0031719 | A1 | 2/2018 | Huang et al. |
| 2018/0348401 | A1 | 12/2018 | Imhof et al. |

OTHER PUBLICATIONS

U.S. Appl. No. 62/752,624, filed Oct. 30, 2018, Huang.
U.S. Appl. No. 62/752,637, filed Oct. 30, 2018, Huang.
Branets, et al. (2015) "Capturing Geologic Complexity in a Simulation Grid", SPE-173270-MS, SPE Reservation Simulation Symposium, Houston, Feb. 2015.
Natali, M. et al. (2012) "Rapid Visualization of Geological Concepts", 2012 25$^{th}$ SIBGRAPI Conference on Graphics, Patterns and Images, Aug. 22-25, 2012, pp. 150-157.
Natali, M. et al. (2013) "Modeling Terrains and Subsurface Geology" in EuroGraphics 2013 State of the Art Reports (STARs), 2013, pp. 155-173.
Duan, P. et al. (2014) "DEM Reconstruction Based on Adaptive Local RBF", in The Open Civil Engineering Journal, Jul. 31, 2014, vol. 8, pp. 232-236.
Nguyen et al. (2014) "A Complete Method for Reconstructing an Elevation Surface of 3D Point Clouds", in REV Journal on Electronics and Communications, vol. 4, No. 3-4, Jul.-Dec. 2014, pp. 91-97.

* cited by examiner

DESIGN SPACE FOR ZONE 1

DESIGN SPACE FOR ZONE 0

FIG. 3
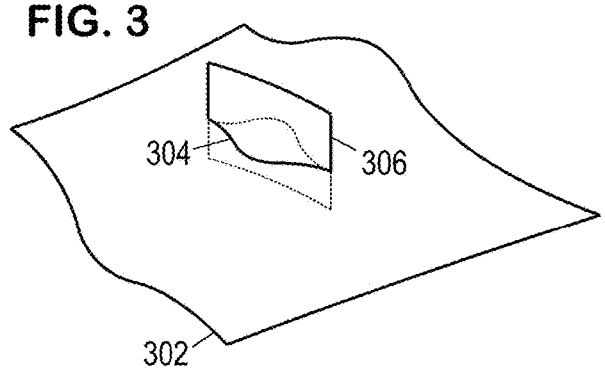
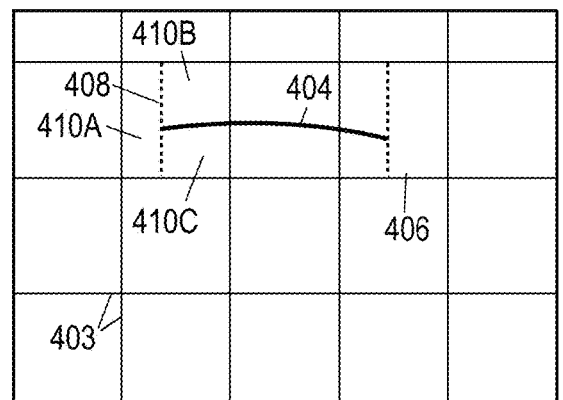
FIG. 4
FIG. 5
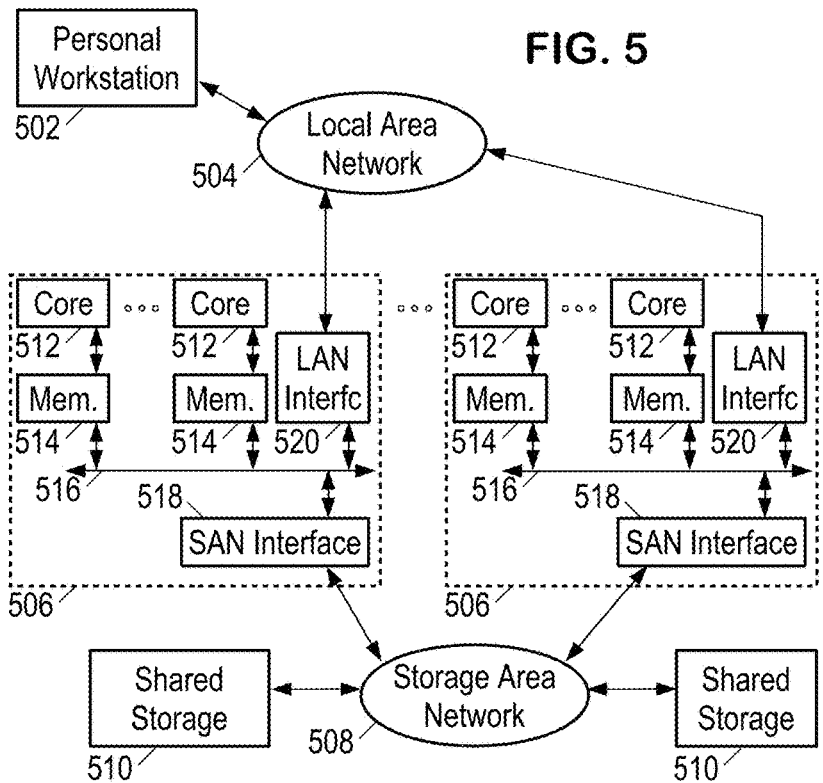

METHOD AND SYSTEM FOR GENERATING SIMULATION GRIDS BY MAPPING A GRID FROM THE DESIGN SPACE

CROSS-REFERENCE TO RELATED APPLICATION

This application claims the benefit of (i) U.S. Provisional Application No. 62/688,553 entitled "Methods and Systems for Modeling Subsurfaces Containing Partial Faults" that was filed Jun. 22, 2018; (ii) U.S. Provisional Application No. 62/752,624 entitled "Method and System for Generating Simulation Grids by Mapping a Grid from the Design Space" that was filed Oct. 30, 2018; and (iii) U.S. Provisional Application No. 62/752,637 entitled "Methods and Systems for Simulation Gridding with Partial Faults" that was filed on Oct. 30, 2018; the disclosures of which are incorporated herein by reference.

TECHNICAL FIELD

The present application relates generally to the field of hydrocarbon exploration, development, and production and, more particularly, to geologic modeling and reservoir simulation. Specifically, the disclosure relates to methods and systems for generating a volumetric mesh (such as a grid) that may be used for various hydrocarbon operations, such as hydrocarbon exploration, development, and/or production operations. For example, the volumetric mesh may be used in various reservoir simulations for evaluating strategies to develop the reservoir and to extract hydrocarbons from the reservoir.

BACKGROUND

A geologic model is a computer-based three-dimensional ("3D") representation of a region beneath the earth's surface. Such models can be used to model a petroleum reservoir, a depositional basin, or other regions which may have valuable mineral resources. Once the model is constructed, it can be used for various purposes, many of which are intended to facilitate efficient and economical recovery of the valuable resources. For example, the geologic model may be used in various hydrocarbon exploration, development, and production operations. For example, the geologic model may be used as an input to simulations of petroleum reservoir fluid flows during production operations, which are used to plan well placements and predict hydrocarbon production from a petroleum reservoir over time.

When performing reservoir simulations, geologic models are typically divided into a mesh of volumetric cells, i.e., volumetric elements having material properties values that are constant (or otherwise well-defined) within each cell. There is a tradeoff between the number and size of volumetric elements, with more numerous smaller elements typically providing higher accuracies at the cost of higher computational demands. A gridding strategy is considered desirable if it minimizes the computational burden for a given level of accuracy, without requiring an inordinate time to complete the gridding process.

An example of a gridding method is described in U.S. Patent Application Publication No. 2012/0265510 which describes a method to create a grid from a depositional space that includes providing a conformal mesh (which is conformal to geological discontinuities of a geologic model) that includes depositional domain coordinates associated with a depositional domain; providing, in the depositional domain, an initial, at least vertically structured multi-dimensional grid, that includes initial nodes that define grid cells; referencing the conformal mesh to identify a set of grid cells of the initial grid traversed by the geological discontinuities; splitting each of the grid cells in the set to form sub cells; and assigning geological domain coordinates to new nodes to generate a final gird. However, the method in U.S. Patent Application Publication No. 2012/0265510 requires that the use of a conformal mesh and a vertically structured grid.

Thus, various gridding strategies are known, but continuing improvements are sought. In particular, it would be desirable to have improved gridding methods that are capable of capturing key geologic features while allowing for robust solution methods. Further, it would be desirable to have gridding methods that account for faulted subsurfaces and do not require pseudo-extension of faults.

SUMMARY

Accordingly, there are disclosed herein geologic modeling methods and systems employing an improved simulation gridding technique that executes quickly and provides better cell alignments. For example, one or more embodiments of the geologic modeling method may comprise: obtaining a geologic model representing a faulted subsurface region in physical space; mapping the physical space geologic model to a design space model representing an unfaulted subsurface region; gridding the design space model to obtain a design space mesh; partitioning cells in the design space mesh with faults mapped from the physical space geologic model, thereby obtaining a partitioned design space mesh; mapping the partitioned design space mesh to the physical space to obtain a physical space simulation mesh; and outputting the physical space simulation mesh. The physical space simulation mesh may be suitable for use in one or more hydrocarbon operations, such as hydrocarbon exploration, development, or production operations. For example, the physical space simulation mesh may be suitable for use in evaluating fluid flow in the subsurface, such as fluid flow during one or more hydrocarbon production operations.

One or more geologic modeling systems described herein may comprise: a memory having geologic modeling software; and one or more processors coupled to the memory to execute the geologic modeling software. The software causes the one or more processors to perform operations that implement the geologic modeling method described herein.

One or more illustrative geologic modeling software product embodiments described herein may comprise a non-transitory information storage medium having computer readable program code embodied therein. When executed, the program code configures a computer to implement the geologic modeling method described herein.

Each of the foregoing embodiments may be employed individually or conjointly, and may further employ one or more of the following features in any suitable combination. For example, in one or more embodiments, outputting the physical space simulation mesh may comprise storing the physical space simulation mesh on a non-transitory information storage device. For example, in one or more embodiments, outputting the physical space simulation mesh may comprise displaying a visual representation of the geologic model with the physical space simulation mesh. For example, in one or more embodiments, the methods described herein may further comprise employing the physical space simulation mesh to evaluate a well placement strategy. For example, in one or more embodiments, gridding may comprise providing an areal grid that spans the design space model; identifying, as nodes, intersections of vertical extrusions of vertices in the areal grid with geobody surfaces in the design space model; and connecting said nodes to form the design space mesh. In one or more embodiments, gridding may comprise subdividing design space mesh cells having a size above a threshold.

BRIEF DESCRIPTION OF THE DRAWINGS

The advantages of the present invention may be better understood by referring to the following detailed description and the attached drawings. It should be understood that the drawings and corresponding detailed description do not limit the disclosure, but on the contrary, they provide the foundation for understanding all modifications, equivalents, and alternatives falling within the scope of the appended claims.

FIG. 3 is a perspective view of an illustrative horizon having a partial fault.

FIG. 4 is a plan view of an illustrative horizon with pseudo-extensions.

FIG. 5 is a block diagram of an illustrative subsurface modeling system.

NOMENCLATURE

Figure 1A:
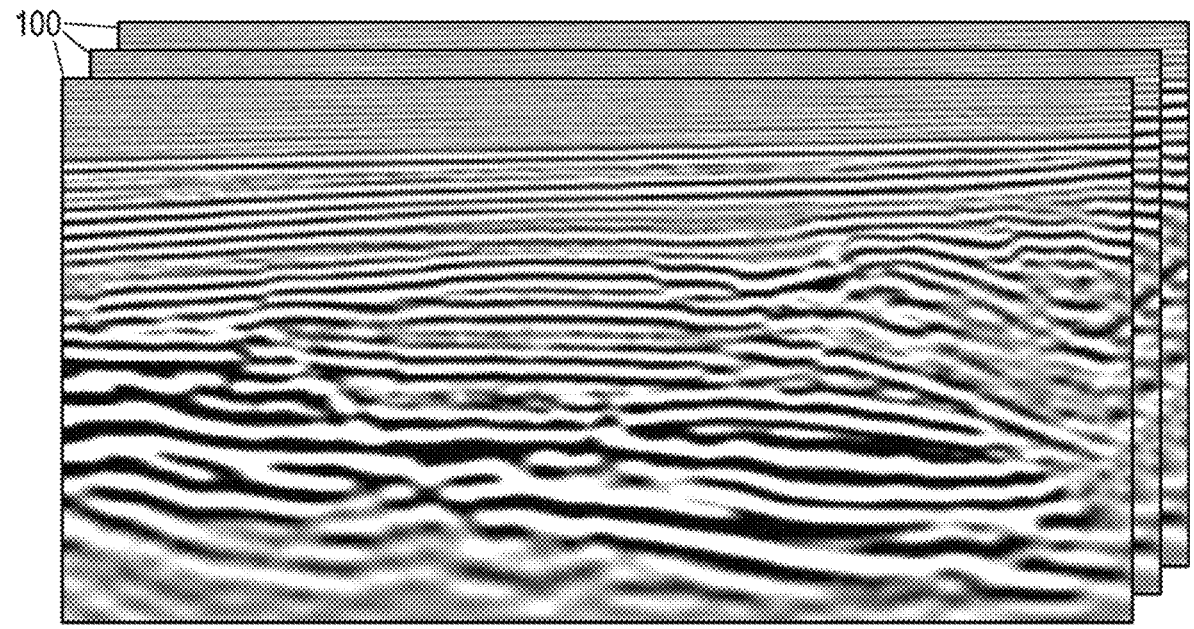
FIG. 1A shows an illustrative measured seismic image volume.

Various terms as used herein are defined herein. To the extent a term used in a claim is not defined herein, it should be given the broadest definition persons in the pertinent art have given that term as reflected in at least one printed publication or issued patent.

As used herein, the term "hydrocarbons" are generally defined as molecules formed primarily of carbon and hydrogen atoms. Hydrocarbons may also include other elements or compounds, such as, but not limited to, halogens, metallic elements, nitrogen, oxygen, sulfur, hydrogen sulfide (H2S), and carbon dioxide (CO2). Hydrocarbons may be located within or adjacent to mineral matrices within the earth (i.e., reservoirs) such as sedimentary rock, sands, silicilytes, carbonates, diatomites, and other porous media. Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models, and determining the likely locations for hydrocarbon reservoirs within the subsurface. The measurement data may include seismic data, gravity data, magnetic data, electromagnetic data, and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of data to identify preferred development approaches and methods. By way of example, hydrocarbon development may include modeling of the subsurface formation and extraction planning for periods of production; determining and planning equipment to be utilized and techniques to be utilized in extracting the hydrocarbons from the subsurface formation; and the like.

As used herein, "hydrocarbon operations" refers to any activity associated with hydrocarbon exploration, hydrocarbon development and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

As used herein, "subsurface model" refers to a reservoir model, geomechanical model, watertight model, and/or a geologic model. The subsurface model may include subsurface data distributed within the model in two-dimensions (e.g., distributed into a plurality of cells, such as elements or blocks), three-dimensions (e.g., distributed into a plurality of voxels), or four or more dimensions.

As used herein, "watertight" means that a specific volume can be divided into one or more volume compartments with boundaries that have no holes and no overlaps with other boundaries. A watertight framework of faults and horizons divides a containing specified volume of interest into one or more volume compartments that have boundaries completely enclosing the compartments. Each fault and horizon is either a boundary of or contained within a volume compartment without any piece outside of a compartment.

As used herein, "surface" refers to geologic features, such as horizons and faults, as well as technical features, such as model boundary, concession boundary, or artificial compartment boundary. A horizon separates two packages of rock. A fault is a discontinuity of rock packages. Often, a fault exhibits displacement. An artificial compartment boundary may be used for accounting purposes.

As used herein, "watertight model" is a model (e.g., three-dimensional model) of the subsurface region having a mesh representing various objects (e.g., faults and/or horizons) and forming one or more watertight compartments.

As used herein, "geologic model" is a model (e.g., three-dimensional model) of the subsurface region having static properties and includes objects, such as faults and/or horizons, and properties, such as facies, lithology, porosity, permeability, or the proportion of sand and shale.

As used herein, "reservoir model" is a model (e.g., three-dimensional model) of the subsurface that in addition to static properties, such as porosity and permeability, also has dynamic properties that vary over the timescale of resource extraction, such as fluid composition, pressure, and relative permeability.

As used herein, "geomechanical model" is a model (e.g., three-dimensional model) of the subsurface that contain static properties, such as rock compressibility and Poisson's ratio, and model the mechanical response (e.g. compaction, subsidence, surface heaving, faulting, and seismic event) of the rock to fluid injection and extraction.

As used herein, "structural framework" or "framework" refer to a subsurface representation formed from objects (e.g., faults, horizons, other surfaces and model boundaries). For example, the framework is a subsurface representation that contains surfaces and polylines. A framework may be formed by surfaces of geologic, engineering, planning or other technical relevance.

As used herein, "mesh" or "grid" is a representation of a region of space (e.g., 2-D domain or 3-D domain), which may include objects, and includes two or more nodes and a set of polygons or polyhedra disposed within the region (e.g., a volumetric representation). The mesh may represent each object by a set of polygons or polyhedra disposed within the region. Properties may be assigned to some or all polygons.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear slip, energy release of the rock as a function of time and space in response to fluid extraction and injection.

DETAILED DESCRIPTION

Various specific embodiments, versions, and examples of the invention will now be described, including preferred embodiments and definitions that are adopted herein for purposes of understanding the claimed invention. While the following detailed description gives specific preferred embodiments, those skilled in the art will appreciate that these embodiments are exemplary only, and that the invention can be practiced in other ways. For purposes of determining infringement, the scope of the invention will refer to any one or more of the appended claims, including their equivalents, and elements or limitations that are equivalent to those that are recited. Any reference to the "invention" may refer to one or more, but not necessarily all, of the inventions defined by the claims.

FIG. 1A shows an illustrative measured seismic image volume 100, which can be expressed in many ways but is here shown as parallel slices of a three-dimensional volume. The measured image volume 100 is typically obtained by processing of field-recorded seismic survey traces representing seismic wave responses to shots or other sources of seismic energy triggered at an array of shot locations. The processing corrects for seismic wave travel times to determine reflective interface locations, and combines repeated measurements at each location to increase the signal to noise ratio. While seismic reflectivity is commonly employed, other seismic wave properties can also or alternatively be derived from the traces and used to construct the measured seismic image volume. One particular transformation is the inversion of the seismic data to estimate petrophysical parameters such as porosity, clay volume fraction, etc. that are often part the geological model.

Figure 1B:
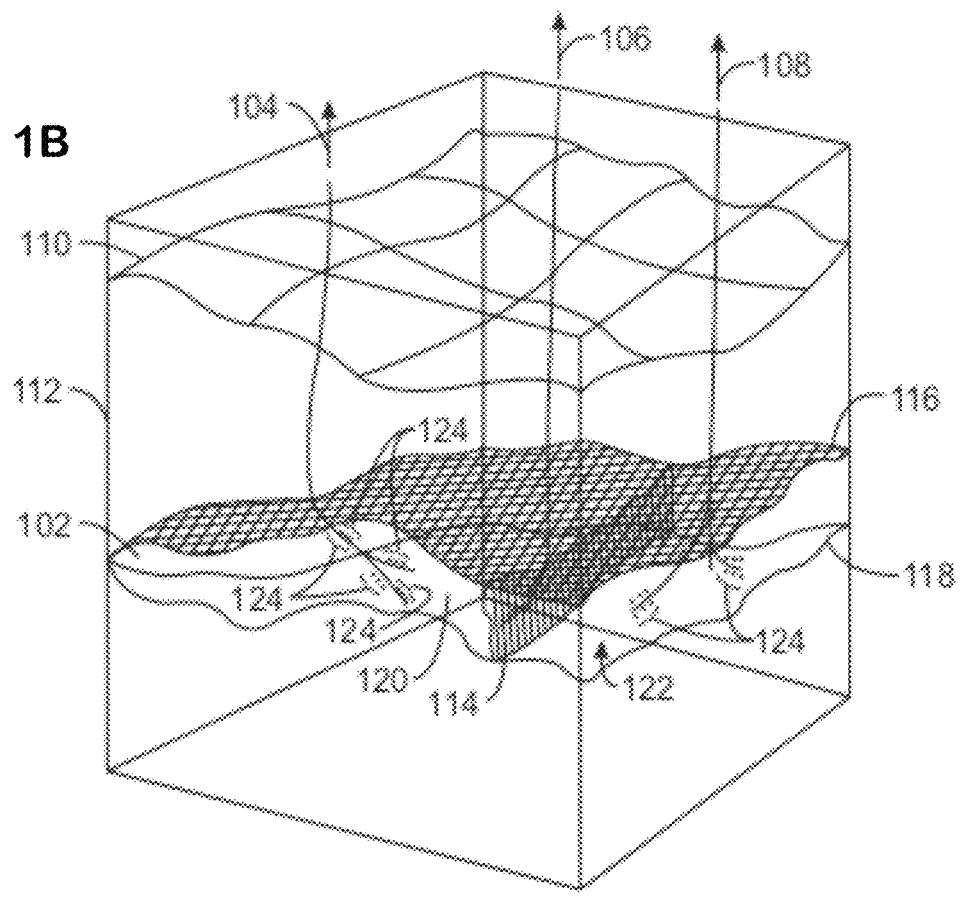
FIG. 1B shows an illustrative "watertight" subsurface model.

FIG. 1B shows an illustrative subsurface model having features that may be derived from a seismic image volume. The illustrative model includes a number of surfaces defining the boundaries of a potentially hydrocarbon-bearing formation 102 that may serve as a reservoir of oil or natural gas. The model facilitates placement and drilling of wells 104, 106, 108, from the Earth's surface 110 through layers of overburden 112 to access the formation 102. The illustrative model surfaces may include faults 114 and horizons 116, 118. The surfaces may intersect in a fashion that divides the reservoir formation 102 into distinct compartments 120, 122. The petrophysical parameters of each compartment may be estimated based on the seismic image data, measured using logging instruments in exploratory wells, and/or other methods known in the art.

Modern drilling techniques enable the wells 104, 106, 108 to deviate from the vertical orientation and to be directionally drilled to follow the reservoir 102. Further, the wells can be branched to increase the amount of wellbore contact with the reservoir, as shown for wells 104 and 108. The wells 104, 106, and 108, can have numerous areas with perforations 124, indicated as dots next to the wells, to provide a flow path for fluids, such as hydrocarbons, from the reservoir 102 into the wells 104, 106, and 108 for removal to the surface. If properly employed, such techniques may enable faster and more efficient extraction of reservoir fluids.

The locations and paths for the wells 104, 106, and 108, and the location of the perforations 124, may be optimized by performing reservoir fluid flow simulations based on the subsurface model. Subsurface models are often used as inputs to reservoir simulation programs that predict the behavior of fluids contained therein and may also predict the behavior of rocks under various scenarios of hydrocarbon recovery. Miscalculations or mistakes can be costly. For example, miscalculations may result in suboptimal locations for the wells 104, 106, and 108, potentially lacking any contact with the reservoir formation. Subsurface model based planning and simulation provide a mechanism to identify which recovery options offer more economic, efficient, and effective development plans for a particular reservoir.

More specifically, subsurface model construction begins with extraction of surfaces from a seismic image volume, including faults, horizons, and defining any additional surfaces such as boundaries for the region of interest. The different surfaces may be adjusted and trimmed to define closed "watertight" volumes often called zones, compartments, or containers, such as zones 120 and 122. "Watertight" here refers to the absence of gaps where boundary surfaces intersect, and such models are readily achieved if the surfaces are represented using continuous functions, which are able to be shifted, extended, and/or trimmed. Such representations facilitate the moving or refining the surfaces to, e.g., test alternatives for resolving interpretation ambiguities. This ability to move and refine surfaces may lead to higher production by impacting the desired positioning of the wells 104, 106, and 108 or the perforations 124.

While beneficial for many purposes, the surface-based representation does not function well for numerical simulation of reservoir fluid flows. For such simulations, it is preferred to have the model gridded into a volumetric mesh in which each cell ("voxel") has homogenous (or otherwise well-defined) material properties and potentially has a defined fluid transmissibility to each neighboring cell with which it shares a cell face. An illustrative method for obtaining a simulation mesh is now described with reference to FIGS. 2A-2E, which for purposes of illustration are two-dimensional, vertical cross-sections of a three-dimensional subsurface model.

Figure 2A:
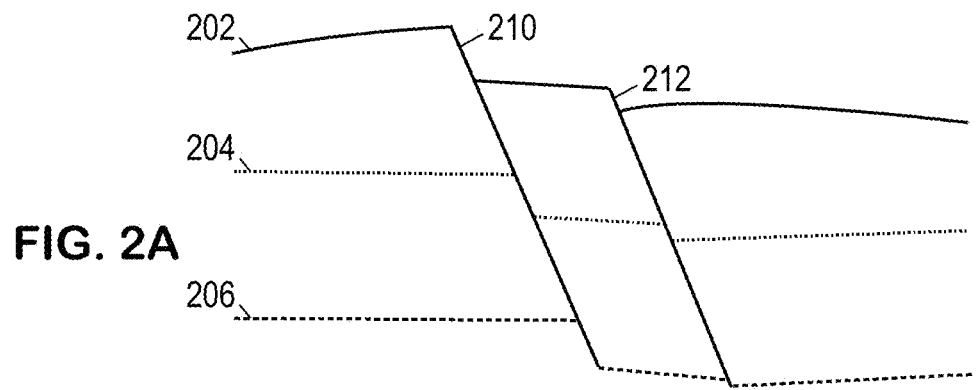
FIG. 2A shows identified features in an illustrative 2D model.

FIG. 2A is a subsurface model in which three horizons 202, 204, 206, and two faults 210, 212, are shown. In accordance with the foregoing description, the horizons and faults may be represented by continuous functions that intersect to form a watertight model. The modeled volume is a useful representation of the physical substructure, but may not be the most convenient representation for engineers to work with. Though a simple example is presented here, faulted models tend to unduly multiply the number of disconnected geobodies such that it becomes difficult and tedious to analyze material properties.

Figure 2B:
FIG. 2B is a cross-section of an initial illustrative design-space model.
Figure 2B:

Accordingly, the "real space" representation shown in FIG. 2A may be transformed into a "design space" representation (sometimes referred to as a "depositional space" representation) such as that shown in FIG. 2B. Thus, the transformation process seeks to "heal" any faults or other discontinuities, thereby restoring all geobodies from their current faulted state and segmented state to a continuous (un-faulted) unified state. An example of such a transformation process is described in U.S. Pat. No. 10,107,938, entitled "Managing Discontinuities in Geologic Models", the disclosure of which is incorporated herein by reference. ("Mapping" refers to a function that associates a input position in physical space with an output position in design space. The function may be explicitly expressed as a mathematical formulation, or as another example, it may be based on a geometric discretization of space in which a mapping function is defined on a cell by cell basis. In the latter case, a point is mapped by first determining which cell it belongs to and then applying the mapping function for that cell. An example of a mapping process is described in U.S. Pat. No. 10,107,938.) The real-space to design-space mapping is preferably derived and applied in a manner that minimizes deformation and preserves in the design space the resemblance to the physical space.

Thus, horizon 202 is been converted from its faulted form in FIG. 2A to a continuous surface in FIG. 2B. Horizon 204, which for the purposes of the present example is an erosion-created surface, defines both the bottom of the upper formation bed and the top of the lower formation bed. In any case, the faults in horizon 204 and the lowermost horizon are also corrected, thereby creating continuous, unfaulted formation beds. Note that as part of the mapping process, the system may numerically analyze and re-align smaller-scale structures on opposing sides of each fault.

Figure 2C:
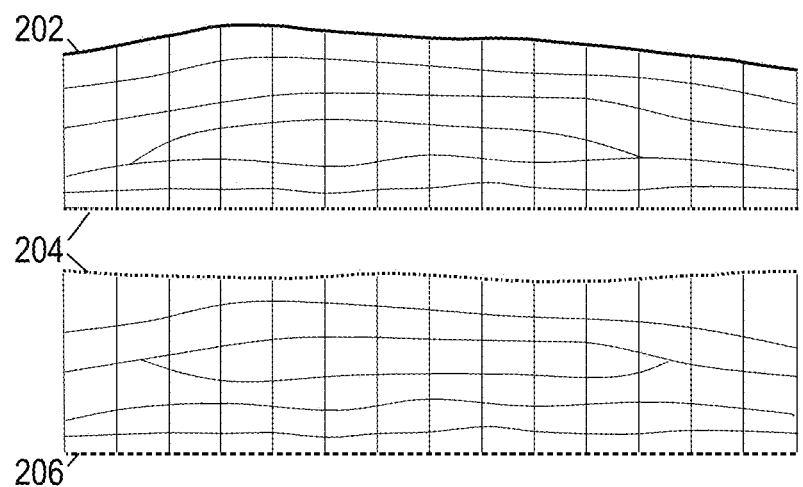
FIG. 2C shows an illustrative gridded design-space model.

The design space facilitates further work by the scientists and engineers to analyze small scale features, identify boundaries of additional geobodies, and determine suitable values for the material properties of each geobody. FIG. 2C shows an illustrative design space model having the additional geobody boundaries represented. Also shown is a mesh derived for the design space model. Various gridding methods are available in the open literature including, e.g., Branets et al., "Capturing Geologic Complexity in a Simulation Grid", SPE-173270-MS, SPE Reservation Simulation Symposium, Houston, February 2015, the disclosure of which is incorporated herein by reference. The illustrated mesh is derived by vertically extruding vertices of an areal grid (e.g., a Cartesian grid in the X-Y plane) and finding intersections of the vertical extrusions with the surfaces representing the geobody boundaries, thereby generating a 3D grid that honors the geobody boundaries. Additionally, the areal grid may be refined (i.e., given a finer resolution) near a well trajectory mapped from the real space and projected to the areal plane. Where the mesh cells are deemed to be too large, they may be subdivided with the introduction of new nodes where needed.

Figure 2D:
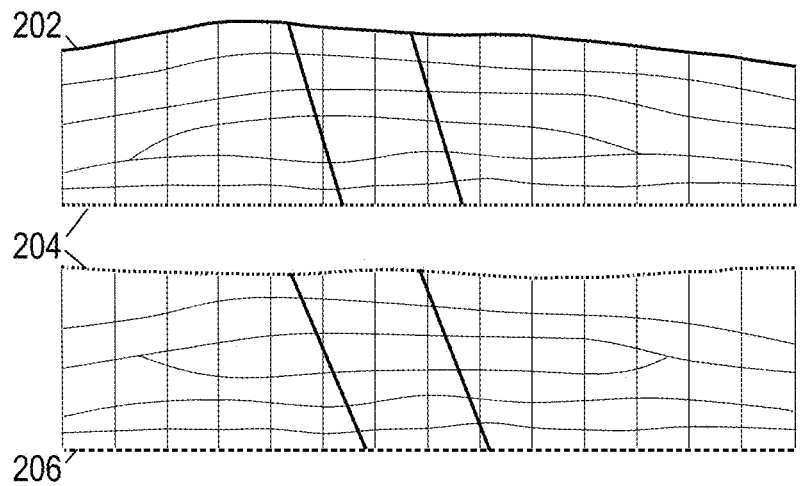
FIG. 2D shows an illustrative faulted design-space model.
Figure 2E:
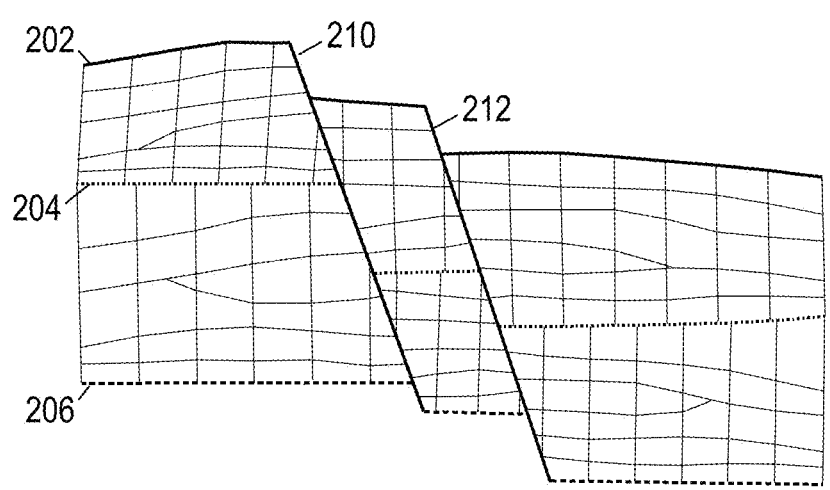
FIG. 2E shows an illustrative gridded 2D real-space model.

In FIG. 2D, real-space to design-space mapping is applied to the faults 210, 212 to determine the fault locations in the design space. The fault surfaces are applied to the mesh to partition the mesh cells that they intersect. Thereafter the derived mapping is applied in reverse to the design-space mesh to obtain a real-space simulation mesh as shown in FIG. 2E.

When the identified faults extend to the boundaries of the model, the foregoing process is straightforward. However, when the model includes partially-faulted surfaces, some additional effort may be needed to address internal discontinuities. (As used herein, a "partial fault" is a fault that does not entirely divide a horizon into separate pieces.) FIG. 3 shows an illustrative horizon 302 having an internal discontinuity 304 along a partial fault 306. Techniques for constructing such representations of such partially faulted surfaces are described in U.S. Patent Application No. 62/688,553, filed Jun. 22, 2018 and entitled "Subsurface modeling with partial faults", which is hereby incorporated herein by reference.

FIG. 4 is a plan view of a horizon 402 having a partial fault 404. The design space grid 403 is established for the model. The design space grid 403 spans the entire region of interest. The cell size for the design space grid is preferably a small fraction of the region of interest, but large enough that the number of mesh cells should not exceed the capability of computational resources available for simulating fluid behavior in the reservoir.

The design space grid cells containing the unterminated ends of the partial fault, e.g., cell 406, are modified to align the edge of the fault with the edge of at least one mesh cell. This may be accomplished by, e.g., dividing the cell along a plane 408 substantially perpendicular to the fault plane. The added plane 408, together with the fault surface and the boundaries of the mesh cell, define three smaller mesh cells 410A, 410B, and 410C. Other subdivisions can be performed, which enable an offset to be introduced between the fault faces during the remapping back to physical space.

The gridding process is followed by assignment of petrophysical parameter values to each mesh cell and/or cell surface. Illustrative parameter values include transmissibility or flow rates between cells, rock type, porosity, permeability, oil saturation, groundwater saturation, gas saturation, clay content, and cementation. The transmissibility between cells on the two sides of a fault in the real space will also be established. For this calculation, a face splitting algorithm may be employed to establish the common area between cells on opposite sides of the fault. The assignment process may employ spatially-correlated reservoir properties and/or fluid properties, and may rely on wellbore measurements, rock type probability maps, and geostatistical distributions. Geostatistics may be used in subsurface models to interpolate observed data and to superimpose an expected degree of variability. Kriging is a suitable geostatistic technique, which uses the spatial correlation among data to construct the interpolation via semi-variograms. Repeated interpolations with different variograms, different seeds, different training images, etc., may be performed to assess spatial uncertainties.

FIG. 5 is a block diagram of an illustrative subsurface modeling system. The illustrative subsurface modeling system includes a personal workstation 502 coupled via a local area network (LAN) 504 to one or more multi-processor computers 506, which are in turn coupled via a storage area network (SAN) 508 to one or more shared storage units 510. Personal workstation 502 serves as a user interface to the subsurface modeling system, enabling a user to load data into the system, to configure and monitor the operation of the system, and to retrieve the results (often in the form of image data) from the system. Personal workstation 502 may take the form of a desktop computer with a display that graphically shows representations of the input and result data, and with a keyboard that enables the user to move files and execute processing software. LAN 504 provides high-speed communication between multi-processor computers 506 and with personal workstation 502. The LAN 504 may take the form of an Ethernet network.

Multi-processor computer(s) 506 provide parallel processing capability to enable suitably prompt processing of the input data to derive the results data. Each computer 506 includes multiple processors 512, distributed memory 514, an internal bus 516, a SAN interface 518, and a LAN interface 520. Each processor 512 operates on allocated tasks to solve a portion of the overall problem and contribute to at least a portion of the overall results. Associated with each processor 512 is a distributed memory module 514 that stores application software and a working data set for the processors' use. Internal bus 516 provides inter-processor communication and communication to the SAN or LAN networks via the corresponding interfaces 518, 520. Communication between processors in different computers 506 can be provided by LAN 504.

SAN 508 provides high-speed access to shared storage devices 510. The SAN 508 may take the form of, e.g., a Fibrechannel or Infiniband network. Shared storage units 510 may be large, stand-alone information storage units that employ magnetic disk media for nonvolatile data storage. To improve data access speed and reliability, the shared storage units 510 may be configured as a redundant disk array ("RAID").

The processors 512 cooperatively execute subsurface modeling software stored in the distributed memory and/or on the shared storage units, which configures to processors to retrieve measurement data and stored model information from the shared storage units 510, operate on the retrieved data and information to implement the modeling methods and improvements disclosed herein, and to store the resulting subsurface models on the shared storage units 510 for future use. Such future use includes visualization methods to convey model information to users, simulation of reservoir fluid movements, and evaluation of well placement and production strategies, enabling users to select sites for drillers to direct boreholes, complete wells, and produce reservoir fluids in an efficient manner.

Figure 6:
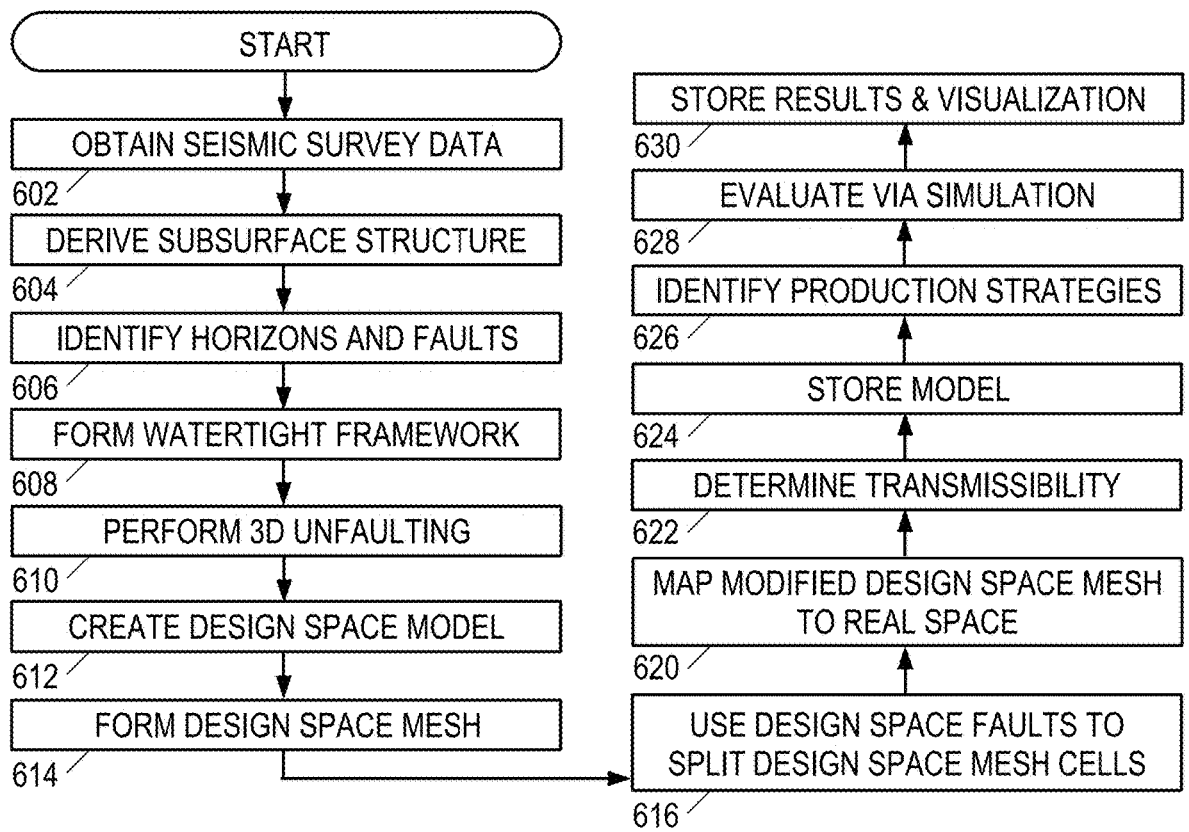
FIG. 6 is a flow diagram of an illustrative subsurface modeling method.

FIG. 6 is a flow diagram of an illustrative subsurface modeling method. It begins in block 602 with the system obtaining seismic survey trace signal data pertaining to a region of interest. In block 604, the system migrates and/or inverts the seismic survey traces to derive at least a high-level picture of the subsurface structure, usually embodied as a volumetric property distribution model in the physical space. In block 606, the physical space model is examined to "interpret" the data, i.e., to identify horizons representing formation boundaries, faults, and any other discernable structures. While this interpretation can be automated to at least some degree, the industry typically employs a geologist or other professional supervise the interpretation process and/or to perform the interpretation manually.

In block 608, the system derives continuous-function based representations of the fault and horizon surfaces, extrapolating and trimming as needed to provide a water-tight subsurface model. In block 610 the system analyzes the faulted formations and derives a real-to-design space mapping that heals the faults. In block 612, the mapping is applied to the real space model to obtain unfaulted horizons and geobodies in design space. The system may perform further guided or unguided analysis of the design space model to identify additional geobodies or horizons that were not evident in the real-space model, and to assign material properties to each geobody. In block 614, the system applies a gridding method to the design space model to derive a design space mesh having cells with homogeneous (or otherwise well-defined) material properties.

In block 616, the system applies the real-to-design space mapping to the faults, determining the design-space location of these faults. The design space mesh cells intersected by the faults are partitioned or otherwise modified to align mesh cell boundaries with the fault surface.

The system then applies the real-to-design space mapping in reverse to map this modified mesh into the real-space model in block 620. In block 622, the system may optionally determine fluid transmissibilities across mesh cell. In block 624, the system stores the model and simulation mesh to disk or some other form of nontransient information storage medium. The system may also display or output the model and, optionally, provide an interactive visualization of the model to a user.

In block 626, the system configures the subsurface model in accordance with an identified production strategy, e.g., by specifying well locations and completion zones. In block 628 the system simulates production from the reservoir to evaluate the identified strategy. Blocks 626 and 628 may be repeated as needed to evaluate different strategies and refinements thereof. In block 630 the system stores at least the results of each simulation, optionally displaying the results and offering an interactive visualization of the simulation and model to a user.

The above described approach to deriving a simulation mesh is expected to yield higher-quality results (in terms of k-orthogonality and cell alignments) with lower computational demands than current methods.

Though the operations shown and described in the flow diagram are treated as being sequential for explanatory purposes, in practice the method may be carried out by multiple processors operating concurrently and perhaps even speculatively to enable out-of-order operations. The ordering and sequential treatment is not meant to be limiting. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.).

Furthermore, as will be apparent to one of ordinary skill in the relevant art, the modules, features, attributes, methodologies, and other aspects of the present disclosure can be implemented as software, hardware, firmware or any combination of the three. Of course, wherever a component of the present disclosure is implemented as software, the component can be implemented as a standalone program, as part of a larger program, as a plurality of separate programs, as a statically or dynamically linked library, as a kernel loadable module, as a device driver, and/or in any other way known to those of skill in the art of computer programming. The software, hardware, or firmware embodying the disclosed methods may implement machine-readable logic, such that a set of instructions or code residing in memory, when executed, causes one or more processors to employ the other components of a computer system as needed to perform the disclosed methods.

What is claimed is:

1. A geologic modeling method that comprises:
   obtaining a geologic model representing a faulted subsurface region in physical space;
   mapping the geologic model to a design space model representing an unfaulted subsurface region;
   gridding the design space model to obtain a design space mesh that is derived from the design space model, wherein said gridding includes: (i) providing an areal grid spanning the design space model in the horizontal direction; (ii) identifying, as nodes, intersections of vertical extrusions of vertices of the areal grid with geobody surfaces in the design space model; (iii) adding additional nodes between the intersections to increase vertical resolution; and (iv) connecting said nodes to form the design space mesh;
   partitioning cells in the design space mesh with faults mapped from the geologic model, thereby obtaining a partitioned design space mesh;
   mapping the partitioned design space mesh to the physical space to obtain a physical space simulation mesh; and
   outputting the physical space simulation mesh.

2. The method of claim 1, wherein said outputting includes:
   storing the physical space simulation mesh on a non-transitory information storage device; and
   displaying a visual representation of the geologic model with the physical space simulation mesh.

3. The method of claim 1, further comprising employing the physical space simulation mesh to evaluate a well placement strategy.

4. The method of claim 1, further comprising refining the areal grid near a well whose trajectory is mapped from the physical space to the design space.

5. The method of claim 1, wherein said gridding further includes: subdividing design space mesh cells having a size above a threshold.

6. The method of claim 1 wherein said partitioning includes: modifying design space mesh cells having an unterminated end of a partial fault so that an edge of the partial fault defines an edge of at least one design space mesh cell.

7. A geologic modeling system that comprises:
   a memory having geologic modeling software; and
   one or more processors coupled to the memory to execute the geologic modeling software, the geologic modeling software causing the one or more processors to perform operations including:
   obtaining a geologic model representing a faulted subsurface region in physical space;
   mapping the geologic model to a design space model representing an unfaulted subsurface region;
   gridding the design space model to obtain a design space mesh that is derived from the design space model, wherein said gridding includes: (i) providing an areal grid spanning the design space model in the horizontal direction; (ii) identifying, as nodes, intersections of vertical extrusions of vertices of the areal grid with geobody surfaces in the design space model; (iii) adding additional nodes between the intersections to increase vertical resolution; and (iv) connecting said nodes to form the design space mesh;
   partitioning cells in the design space mesh with faults mapped from the geologic model, thereby obtaining a partitioned design space mesh;
   mapping the partitioned design space mesh to the physical space to obtain a physical space simulation mesh; and
   outputting the physical space simulation mesh.

8. The system of claim 7, wherein said outputting includes:
   storing the physical space simulation mesh on a non-transitory information storage device; and
   displaying a visual representation of the geologic model with the physical space simulation mesh.

9. The system of claim 7, wherein the operations further include employing the physical space simulation mesh to evaluate a well placement strategy.

10. The system of claim 7, wherein said gridding further includes: subdividing design space mesh cells having a size above a threshold.

11. The system of claim 7, wherein said partitioning includes: modifying design space mesh cells having an unterminated end of a partial fault so that an edge of the partial fault defines an edge of at least one design space mesh cell.

12. A non-transitory information storage product having computer readable program code embodied therein, which when executed configures a computer to implement a geologic modeling method that comprises:
   obtaining a geologic model representing a faulted subsurface region in physical space; mapping the geologic model to a design space model representing an unfaulted subsurface region;
   gridding the design space model to obtain a design space mesh that is derived from the design space model, wherein said gridding includes: (i) providing an areal grid spanning the design space model in the horizontal direction; (ii) identifying, as nodes, intersections of vertical extrusions of vertices of the areal grid with geobody surfaces in the design space model; (iii) adding additional nodes between the intersections to increase vertical resolution; and (iv) connecting said nodes to form the design space mesh;
   partitioning cells in the design space mesh with faults mapped from the geologic model, thereby obtaining a partitioned design space mesh;

mapping the partitioned design space simulation mesh to the physical space to obtain a physical space simulation mesh; and outputting the physical space simulation mesh.

13. The non-transitory information storage product of claim 12, wherein said outputting includes:

storing the physical space simulation mesh on a non-transitory information storage device; and displaying a visual representation of the geologic model with the physical space simulation mesh.

14. The non-transitory information storage product of claim 12, wherein the method further comprises: employing the physical space simulation mesh to evaluate a well placement strategy.

15. The non-transitory information storage product of claim 12, wherein said gridding includes: subdividing design space mesh cells having a size above a threshold.

16. The non-transitory information storage product of claim 12, wherein said partitioning includes: modifying design space mesh cells having an unterminated end of a partial fault so that an edge of the partial fault defines an edge of at least one design space mesh cell.

* * * * *